(12) United States Patent
Lin et al.

(10) Patent No.: US 6,278,356 B1
(45) Date of Patent: Aug. 21, 2001

(54) FLAT, BUILT-IN RESISTORS AND CAPACITORS FOR A PRINTED CIRCUIT BOARD

(75) Inventors: Wen-Yen Lin; Lin-Yeh Chen; Chin-Chi Chang; Shih-Ting Huang, all of Taoyuan Hsien (TW)

(73) Assignee: Compeq Manufacturing Company Limited, Taoyuan Hsien (TW)

( * ) Notice: Subject to any disclaimer, the term of this patent is extended or adjusted under 35 U.S.C. 154(b) by 0 days.

(21) Appl. No.: 09/572,142

(22) Filed: May 17, 2000

(51) Int. Cl.$^7$ ................................................. H01L 1/012
(52) U.S. Cl. ........................ 338/309; 338/310; 361/761
(58) Field of Search .................................. 338/306, 309, 338/310, 311; 361/761, 766

(56) References Cited

U.S. PATENT DOCUMENTS

| | | | |
|---|---|---|---|
| 3,949,275 | * 4/1976 | Muenz | 361/766 |
| 4,139,832 | * 2/1979 | Yoshino et al. | 338/308 |
| 4,460,938 | * 7/1984 | Clei | 361/766 |
| 4,629,681 | * 12/1986 | Takada et al. | 361/766 |
| 4,766,412 | * 8/1988 | Takakura et al. | 338/334 |
| 4,783,642 | * 11/1988 | Takada et al. | 338/309 |
| 5,708,569 | * 1/1998 | Howard et al. | 361/766 |
| 5,757,076 | * 5/1998 | Kambara | 338/309 |
| 5,920,454 | * 7/1999 | Numura et al. | 361/766 |
| 6,021,050 | * 2/2000 | Ehman et al. | 361/766 |
| 6,128,199 | * 10/2000 | Kambara | 361/766 |

* cited by examiner

Primary Examiner—Karl D. Easthom
(74) Attorney, Agent, or Firm—Hedman & Costigan, PC

(57) ABSTRACT

A flat, built-in resistor and capacitor has a substrate (10) made of dielectric material; a copper layer (12) formed on each surface of the substrate (10) and having an etched image (30) formed in each of the copper layers (12); a dielectric material layer (40) printed onto the copper layer (12) and filling up the etched image; and a resistance layer (50) printed onto the copper layer (12) and the dielectric material layer (40).

5 Claims, 3 Drawing Sheets

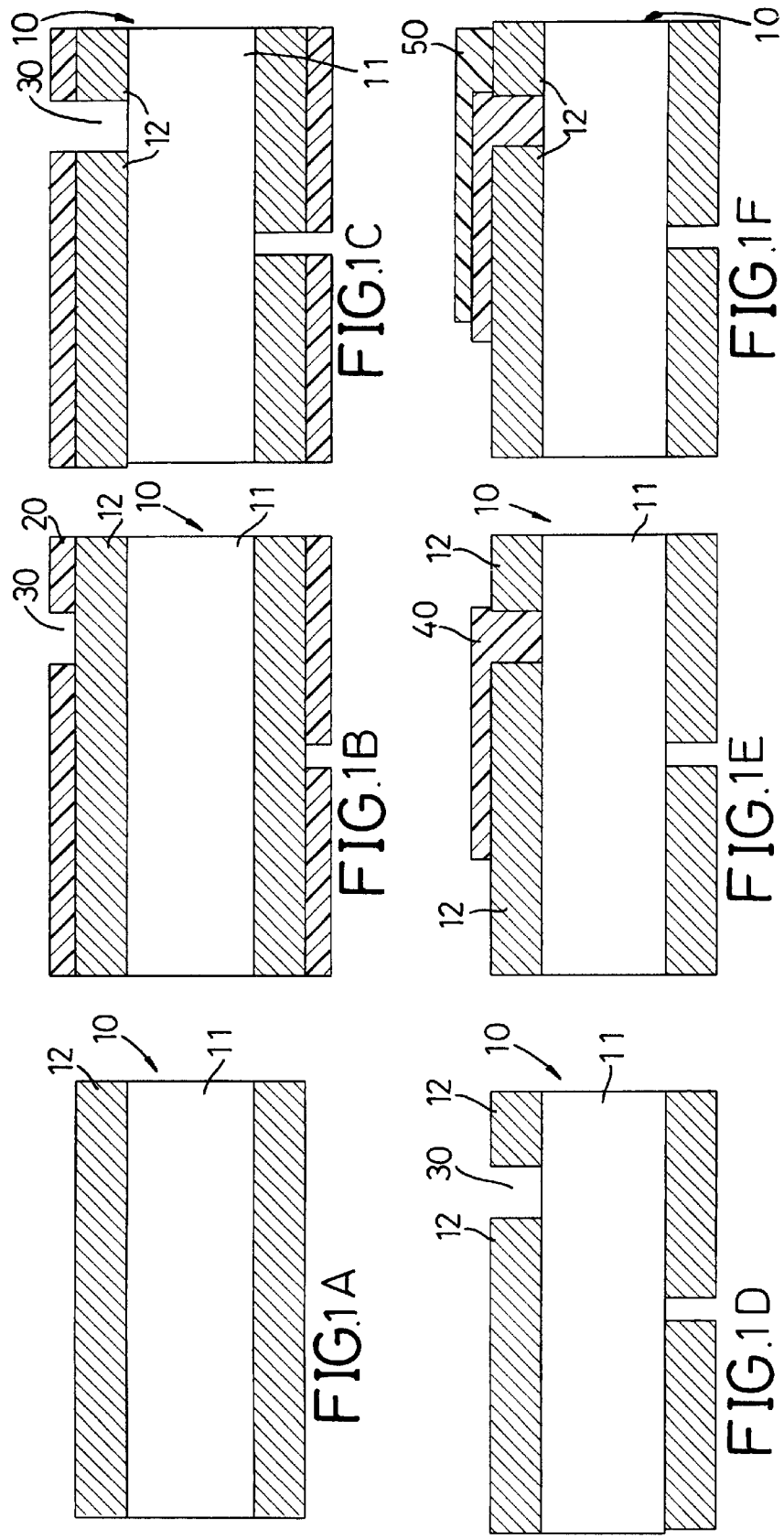

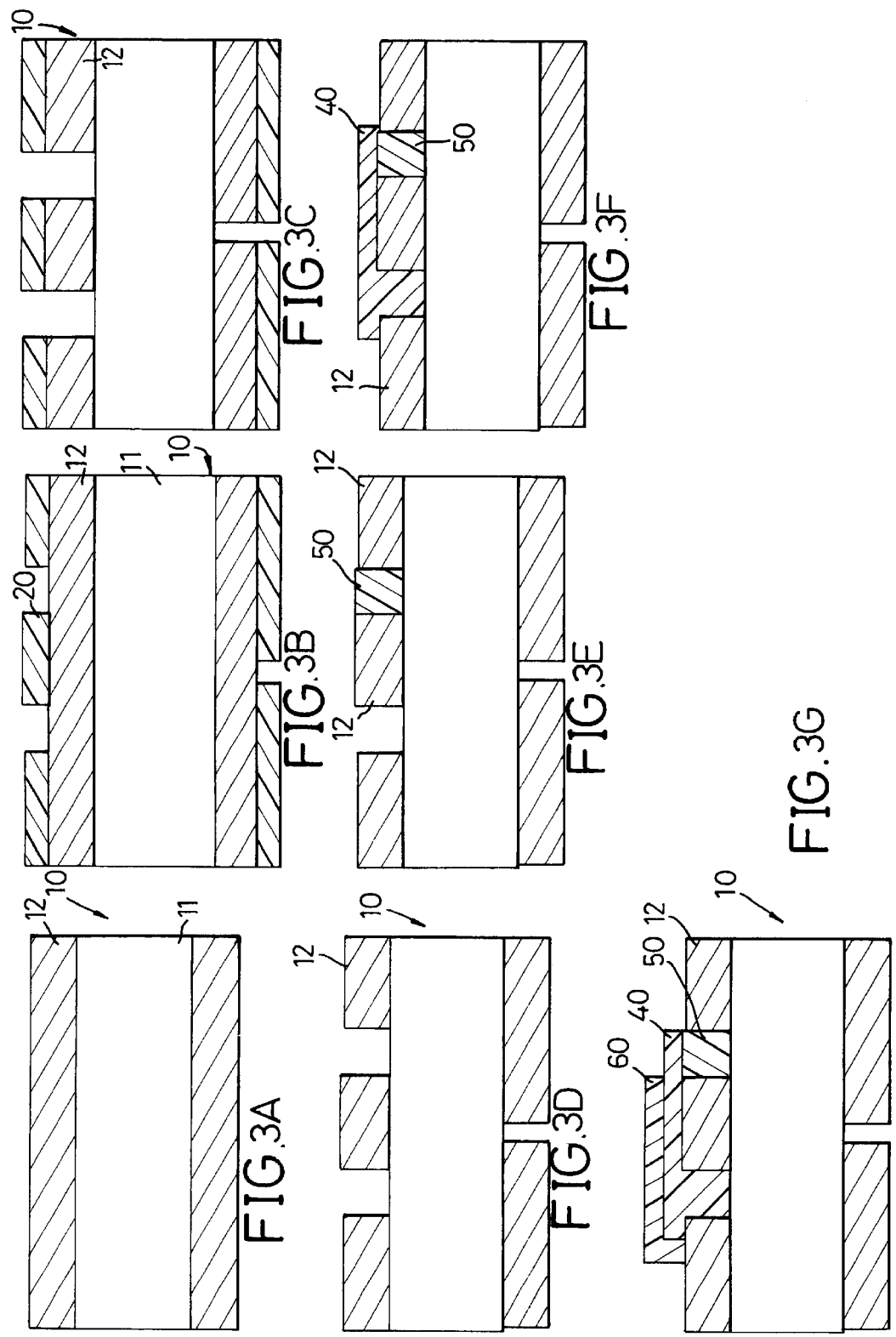

FLAT, BUILT-IN RESISTORS AND CAPACITORS FOR A PRINTED CIRCUIT BOARD

BACKGROUND OF THE INVENTION

1. Field of the Invention

The present invention relates to a flat, built-in resistors and capacitors for a printed circuit board, and particularly, to a flat resistor and capacitor simultaneously formed on a substrate by etching.

2. Description of Related Art

Many circuits are on or inside a multi-layered printed circuit board. The circuits serve as an electrical connection or distribute signals among the electronic components. However. to respond to the fast development in information technology and the great increase in functions, more components are needed and higher density of components is needed on printed circuit boards. Under these circumstances, some problems occur.

1. As the quantity of electronic components increases, the distance between adjacent components is dramatically reduced so as to promote the opportunity for radio disturbance among them. thus adversely affecting the stability of the operating circuit.

2. Due to the greater quantity of electronic components, different routes are needed for transmission of the signals among components (for example, through connected holes for electrical connection or conveyance of signals), thus impedance mismatch and chaotic signals in the circuit are added.

3. Due to the greater quantity of electronic components, the excellent production yield of the circuit boards is reduced resulting in increased production cost.

4. The greater quantity of electronic components on a circuit board necessitates an increase in the total area of the circuit board.

To avoid the foregoing problems in high-density printed circuit boards, OHMEGA company has developed a new technology in terms of built-in resistors to replace the resistors assembled on the surface of the printed circuit board. The principle of this technology is based on the following formula:

$$R=(\rho/t)\times L/W$$

wherein R=resistance, $\rho$=resistance coefficient, t=thickness, and W=width.

According to the foregoing formula, the value of R can be adjusted by changing the length L, the width W or both. Therefore, OHMEGA produces resistors having the desired resistance by also adjusting the values of the resistance coefficient $\rho$ and the thickness t.

Additionally, in current multi-layered printed circuit boards, the resistors are formed inside the circuit board to form built-in resistors to effectively replace the resistors formed on the surface of the circuit board so as to reduce the area occupied by components on the surface of the circuit board.

In addition to built-in resistors capacitors are often formed in many ways. in current multi-layered printed circuit boards, two layers (for example, VCC and GND) having different potential are separated by a small distance to produce an additional capacitor between the copper surface of these two layers and are used to adjust the voltage. The formula for the foregoing capacitor is:

$$C(\text{capacitance})=\in_r(\text{dielectric value})\times A(\text{area})/d(\text{separation})$$

wherein the $\in_r$ is dependent on the material used and thus the capacitance needed can be controlled by changing the area A and the separation d.

In view of the foregoing, components, such as resistors and the capacitors, can be practically formed inside the circuit board to free space on the surface of the circuit board. However, the foregoing built-in and embedded resistors and capacitors are formed by independent techniques rather than being formed simultaneously with the board, such that the manufacturing steps are complicated. In addition, the resistors and the capacitors are formed on a different substrate resulting in the waste of material and increasing the manufacturing cost. Therefore, a need still exists to provide a new flat, built-in resistor and capacitor for a printed circuit board.

SUMMARY OF THE INVENTION

One objective of the present invention is to provide a new flat, built-in resistor and capacitor for a printed circuit board.

To achieve the objective, the method to produce the flat, built-in resistor and capacitor for a printed circuit board in accordance with the present invention includes the step of forming a copper layer on one surface of a high-dielectric substrate by a pressing technique.

Another objective of the present invention is to reduce the disturbance by electromagnetic waves when forming the foregoing substrate.

To achieve this objective, the method for forming the foregoing substrate comprises steps of applying a photo resist layer, transfer of an image and etching where the dielectric coefficient and the thickness of the circuit board are constant.

Another objective of the present invention is to provide a formula to design flat resistors with a specified resistance.

To achieve the objective. the resistance of the flat resistor is based on the following formula:

$$C=k\times\in_{r\times A/t}$$

wherein the $\in_r$ is the dielectric coefficient, A is the area for embedding the resistors, t is the thickness (mil) of the high-dielectric substrate, and k is a constant.

The foregoing formula is based on the following formula:
$$R=\rho\times L/A=(\rho/T)\times(L/W)$$

wherein the $\rho$ is the resistance coefficient of the layer of high-dielectric material, and L, W, and T respectively are the length, width and thickness of the layer of high-dielectric material.

Other objectives, advantages, and novel features of the invention will become more apparent from the following detailed description when taken in conjunction with the accompanying drawings.

BRIEF DESCRIPTION OF THE DRAWINGS

FIGS. 1A to 1F are sequential cross sectional side plan views of flat, built-in resistor in accordance with the present invention at each manufacturing step:

FIGS. 3A to 3G are sequential cross sectional side plan views of a flat, surface capacitor in accordance with the present invention at each manufacturing step.

DETAILED DESCRIPTION OF THE PREFERRED EMBODIMENT

Figure 2A:
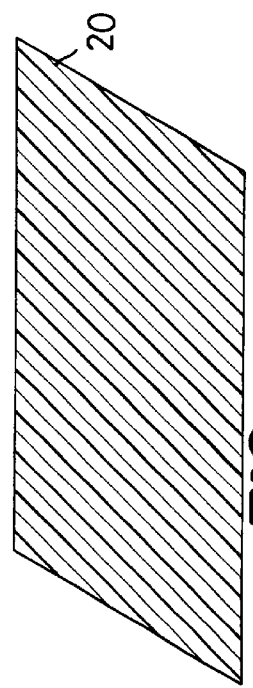
FIGS. 2A to 2F are sequential cross sectional top plan views of a flat, surface capacitor in accordance with the present invention at each manufacturing step.
Figure 2B:
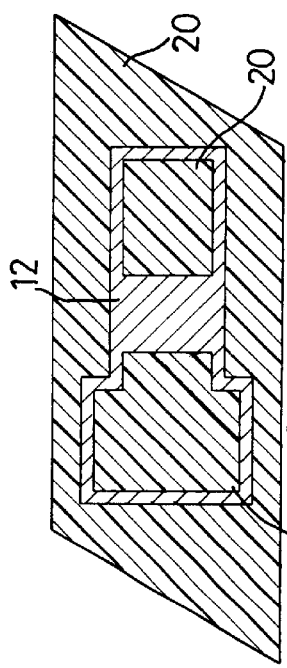

With reference to FIGS. 1 and 3, the steps to manufacture flat, built-in resistors or capacitors in accordance with the present invention comprise "forming a substrate", "applying the photo resist and transferring the image", "etching the image". "removing the photo resist", "printing dielectric layers", "printing resistance layers" and "printing conductive layers" for capacitors.

With reference to FIG. 1A, the step of forming a substrate (10) is shown. The substrate (10) is the fundamental materials for manufacturing the flat, resistors; and the substrate (10) is a isolating material plate (11) having copper layers (12) formed on the top and the bottom surface.

With reference to FIG. 1B, in the step of applying photo resist and the transferring the image, both the bottom and the top surfaces of the substrate (10) are coated with photo resist (20), and the image (30) is transferred to both surfaces by light through a mask. The image (30) will determine the capacitance value of the flat, surface capacitor to be made.

With reference to FIG. 1C, after transferring the image, the step of the etching the image is carried out. In the step of etching the image, the exposed copper layers (12) under the image (30) are etched.

After the step of the etching the image, the step of removing the photo resist from the substrate is carried out.

With reference to Fig. 1E, the dielectric materials (40) are printed onto specific places on the surface of the substrate (10) (for example, in the image (30) area and covering a part of the copper layers (12) ). The dielectric materials (40) are selected from the group consisting of materials with a high dielectric coefficient, such as resin.

Afterwards, a resistance layer (50) is printed onto the copper layer (12). This resistance layer (50) covers a part of the copper layer (12) and the dielectric materials (40). Thus, a resistance is formed between and the copper layers (12); a capacitor is formed among the resistance layer (50) and the copper layer (12). The practical resistance value of the flat, built-in resistor can be calculated by the following formula:

$$R = \rho \times L/A = (\rho/T) \times (L/W)$$

where $\rho$ is the resistance coefficient of the resistance layer (50) and L, W, and T respectively are the length, of the resistance layer (50) between copper layers (12) width and thickness of the resistance layer (50). Therefore, when the step of printing the conductive material is carried out, the desired resistance value of the flat, built-in resistor can be obtained by adjusting the length, the width and the thickness of the resistance layer (50).

A specific capacitance is obtained based on the following formula:

$$C = k \times \in_r \times A/t$$

where $\in_r$ is the dielectric coefficient of the dielectric layer (40), A is the area of the copper layers (12) that coincide with the resistance layer (50), t is the thickness (in mils) of the dielectric layer (40) and K is a constant, preferably 225.

According to the foregoing formula, the desired capacitance is determined by the image (30) and the extent of the etched copper layers (12) and by the surface area of the image (30). The dimensions ofthe image (30) simultaneously determine the location of the flat, surface capacitor.

With reference to FIG. 2, another embodiment of the steps for preparing flat, built-in resistors and capacitors in accordance with the present invention comprises forming a copper layer on the top and the bottom surfaces of the substrate (neither the copper layer nor the substrate are shown). Then, a photo resist layer (20) is applied to each copper layer. Subsequently, the images are transferred to the photo resist layer (20). Afterwards, the photo resist (20) on the transferred image is removed through a mask (as shown in FIG. 2B).

Figure 2C:
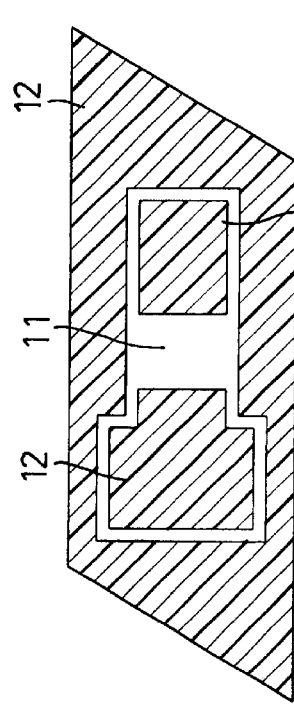

After removing the photo resist (20), the exposed copper layer (12) is removed by etching and then the remaining photo resist (20) is removed (as shown in FIG. 2C).

Figure 2D:
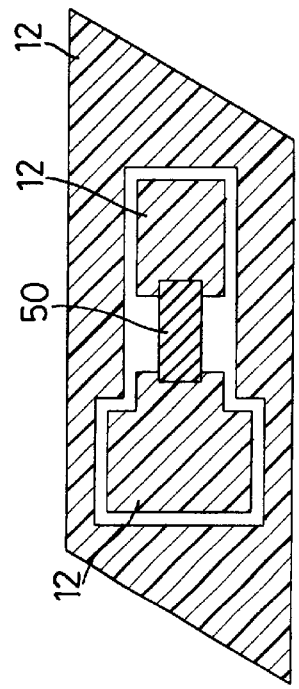
Figure 2E:
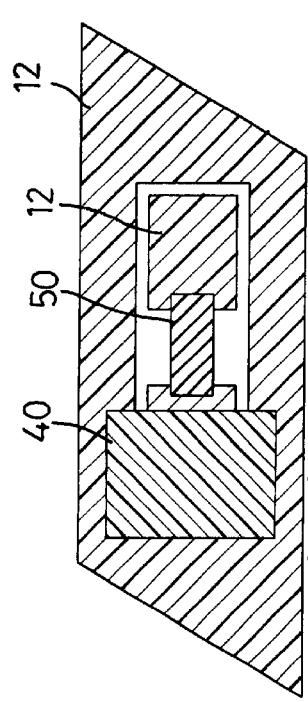
Figure 2F:
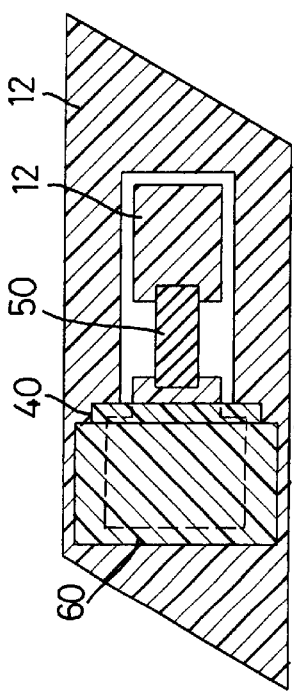

With reference to FIG. 2D, after removing the photo resist (20), a layer of resistance layer (50) is formed between the two isolated copper areas (12) by printing. Then, dielectric material (40) is printed near one end of the resistance layer (50). With reference to FIG. 2F, a layer of highly conductive material (60) is printed onto the dielectric material (40). With reference to FIG. 2F, as a result, a flat, built-in resistor is formed between and the exposed copper layers (12); and a capacitor is formed between the highly conductive material (60) and the copper layer (12).

With reference to FIGS. 3A to 3G, similar to the method shown in FIGS. 1A to 1F, a substrate (10) made of isolating material (11) has a copper layer (12) on the top and the bottom surface of the substrate (10). A photo resist layer (20) is then applied to each copper layer (12). An image is transferred to the photo resist layer (20), and then the photo resist (20) under the image is removed. The exposed copper layer (12) is then etched and the remaining photo resist (20) is removed. Afterwards, a resistance layer (50) is coated between two copper layers (12) and a dielectric material (40) is printed onto the other two copper layers (12). The dielectric material (40) also covers the resistance layer (50) resulting in a resistance if formed between the resistance layer (50) and the copper layers (12).

Afterwards, a highly conductive material (60) is printed near one end of the dielectric material (40) to form a capacitor between the highly conductive material (60) and the copper layer (12).

The foregoing substrate having flat, built-in resistors and capacitors is used with a printed circuit board, and then the PCB manufacturing steps such as pressing and puncturing are carried out to formed a printed circuit board having built-in flat, built-in resistors and capacitors and with reduced parasitic capacitance inductance and resistance in the wiring resulting in a better signal transmission passage. Additionally, the quantity of resistors and capacitors formed on the surface of the printed circuit board can be greatly reduced to free surface area on the printed circuit board for other applications including electrical connection, signal transmission or other work and promotion of additional functions.

Furthermore since flat, built-in resistors and capacitors can be formed simultaneously on the same substrate, the waste of material and the manufacturing cost will be greatly reduced.

In addition to the foregoing advantages, the flat, built-in resistors and capacitors can be used in the alternative terminal method in the high-frequency circuits to reduce the mixing of reflected signals. (The term "alternative terminal method" refers to a resistor R and a capacitor C serially connected in a conventional high frequency circuit between the transmission wire and the ground wire to remove the reflected signals in the signal transmission to maintain the quality of signal transmission.)

In the conventional high frequency circuit, the resistor R and the capacitor C are connected outside of the printed circuit board. Similar to high-density printed circuit boards, too many surface-connected components will lead to problems with interfering signals that reduce the signal quality and add to the cost. However, with the flat, built-in resistors and capacitors, the foregoing problems will be resolved.

The quantity of components such as resistors and capacitors used in conventional printed circuit boards is huge. However, with the flat, built-in resistors and capacitors in accordance with the present invention, the resistors and the capacitors can be built into the printed circuit board and free a lot of surface area on the printed circuit board to accommodate additional electric connection, signal transmission and other work or the addition of additional functions. Therefore, the flat, built-in resistors and capacitors in accordance with the present invention can resolve problems in high density circuits.

Although the present invention has been explained in relation to its preferred embodiment, it is to be understood that many other possible modifications and variations can be made without departing from the spirit and scope of the invention as hereinafter claimed.

What is claimed is:

1. A flat, built-in resistor and capacitor, comprising:

a substrate made of isolating material;

a copper layer formed on a first surface and a second surface of the substrate and having an etched image formed in each of the copper layers;

a dielectric material layer printed out onto the copper layer formed on the first surface of the substrate and filling up the etched image formed on the first surface of the substrate; and a resistance layer printed onto the copper layer formed on the first surface of the substrate and the dielectric material layer.

2. The flat, built-in-resistor and capacitor as claimed in claim 1, wherein the dielectric material layer has a constant dielectric coefficient and thickness, and a desired capacitance can be achieved by controlling the surface area of the copper.

3. A flat, built-in resistor and capacitor, comprising:

a substrate made of isolating material;

a copper layer formed on a first surface and a second surface of the substrate and having an etched image formed in each copper layer;

a resistance layer printed onto the copper layer and at least one other etched region therein formed on the first surface of the substrate and the etched image formed on the first surface of the substrate;

a dielectric material layer printed onto the copper layer and at least one other etched region therein formed on the first surface of the substrate and the resistance layer; and a high conductive material layer printed onto the copper layer formed on the first surface of the substrate and the dielectric material layer.

4. The flat, built-in resistor and capacitor as claimed in claim 3, wherein the dielectric material layer has a constant dielectric coefficient and thickness, and the capacitance can be obtained by varying the surface area of the copper.

5. A flat, built-in resistor and capacitor, comprising:

a substrate made of isolating material;

a copper layer formed on each surface of the substrate and having an etched image formed in each of the copper layers;

a resistance layer printed onto each of the copper layers and each of the etched images;

a dielectric material layer printed onto each of the copper layers and at least one other etched region therein and each of the resistance layers; and a high conductive material layer printed onto each of the copper layers and each of the dielectric material layers.

* * * * *